United States Patent
Chen et al.

(10) Patent No.: US 9,913,412 B2
(45) Date of Patent: Mar. 6, 2018

(54) SHIELDING STRUCTURES FOR SYSTEM-IN-PACKAGE ASSEMBLIES IN PORTABLE ELECTRONIC DEVICES

(71) Applicant: Apple Inc., Cupertino, CA (US)

(72) Inventors: Yanfeng Chen, San Ramon, CA (US); Shankar S. Pennathur, San Jose, CA (US)

(73) Assignee: Apple Inc., Cupertino, CA (US)

( * ) Notice: Subject to any disclaimer, the term of this patent is extended or adjusted under 35 U.S.C. 154(b) by 328 days.

(21) Appl. No.: 14/308,386

(22) Filed: Jun. 18, 2014

(65) Prior Publication Data
US 2015/0271959 A1 Sep. 24, 2015

Related U.S. Application Data

(60) Provisional application No. 61/955,032, filed on Mar. 18, 2014.

(51) Int. Cl.
*H05K 7/00* (2006.01)
*H05K 9/00* (2006.01)
(Continued)

(52) U.S. Cl.
CPC ......... *H05K 9/0024* (2013.01); *H05K 1/0215* (2013.01); *H05K 1/0218* (2013.01);
(Continued)

(58) Field of Classification Search
CPC .... H05K 1/185; H05K 2201/10; H05K 3/284; H05K 2201/09872; H05K 2203/1377;
(Continued)

(56) References Cited

U.S. PATENT DOCUMENTS

| | | |
|---|---|---|
| 5,461,545 A | 10/1995 | Leroy et al. |
| 5,483,261 A | 1/1996 | Yasutake |

(Continued)

FOREIGN PATENT DOCUMENTS

| | | |
|---|---|---|
| CN | 102054821 A | 5/2011 |
| EP | 0 130 279 A2 | 1/1985 |

(Continued)

OTHER PUBLICATIONS

International Search Report dated Nov. 23, 2015, for PCT Application No. PCT/US2015/028654, filed Apr. 30, 2015, nine pages.
(Continued)

*Primary Examiner* — Binh Tran
(74) *Attorney, Agent, or Firm* — Morrison & Foerster LLP

(57) ABSTRACT

A portable electronic device packaged into a System-in-Package assembly is disclosed. The portable electronic device can include a substrate and a plurality of components mounted on the substrate and included in one or more subsystems. Interference between subsystems or from external sources can be reduced or eliminated by disposing an insulating layer over the components, forming narrow trenches between subsystems, and conformally coating the insulating layer and trenches with a metal shielding layer. In some examples, trenches between subsystems can be formed using a laser source. In some examples, trenches between subsystems can have angled walls. In some examples, the metal shielding layer can be formed using at least one of electroplating, electroless plating, chemical vapor deposition, and physical vapor deposition.

16 Claims, 15 Drawing Sheets

(51) Int. Cl.
*H05K 1/02* (2006.01)
*H05K 3/28* (2006.01)
*H05K 1/18* (2006.01)
*H05K 1/16* (2006.01)

(52) U.S. Cl.
CPC .......... *H05K 3/284* (2013.01); *H05K 9/0039* (2013.01); *H05K 2201/0715* (2013.01); *H05K 2201/0723* (2013.01); *H05K 2201/09972* (2013.01); *H05K 2201/1056* (2013.01)

(58) Field of Classification Search
CPC .......... H05K 3/285; H05K 2201/0707; H05K 9/0081; H05K 9/0022; C23C 14/04; C23C 18/06; C23C 18/1603; H01L 23/28
USPC ....... 361/760, 761, 762, 765, 777, 816, 818; 174/521
See application file for complete search history.

(56) References Cited

U.S. PATENT DOCUMENTS

| | | | |
|---|---|---|---|
| 5,488,204 | A | 1/1996 | Mead et al. |
| 5,639,989 | A * | 6/1997 | Higgins, III .......... H01L 23/552 174/386 |
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,625,026 | B1 | 9/2003 | Boudreaux et al. |
| 6,690,387 | B2 | 2/2004 | Zimmerman et al. |
| 6,858,930 | B2 | 2/2005 | Miller et al. |
| 7,015,894 | B2 | 3/2006 | Morohoshi |
| 7,184,064 | B2 | 2/2007 | Zimmerman et al. |
| 7,187,060 | B2 | 3/2007 | Usui |
| 7,663,607 | B2 | 2/2010 | Hotelling et al. |
| 7,808,781 | B2 | 10/2010 | Colgan et al. |
| 8,212,340 | B2 | 7/2012 | Liao |
| 8,304,289 | B2 | 11/2012 | Usui et al. |
| 8,373,256 | B2 * | 2/2013 | Kaneko ............... H01L 23/5225 257/659 |
| 8,479,122 | B2 | 7/2013 | Hotelling et al. |
| 8,536,713 | B2 | 9/2013 | Teig |
| 9,820,373 | B2 | 11/2017 | Pennathur et al. |
| 2002/0034066 | A1 | 3/2002 | Huang et al. |
| 2003/0155987 | A1 | 8/2003 | Kolb et al. |
| 2004/0194988 | A1 | 10/2004 | Chen |
| 2005/0167849 | A1 | 8/2005 | Sato |
| 2006/0131735 | A1 | 6/2006 | Ong et al. |
| 2006/0197753 | A1 | 9/2006 | Hotelling |
| 2008/0211088 | A1 | 9/2008 | Sato |
| 2009/0000114 | A1 * | 1/2009 | Rao ...................... H01L 23/552 29/832 |
| 2009/0079041 | A1 | 3/2009 | Huang et al. |
| 2009/0115037 | A1 | 5/2009 | How et al. |
| 2009/0127700 | A1 | 5/2009 | Romig |
| 2010/0207257 | A1 | 8/2010 | Lee |
| 2010/0285636 | A1 | 11/2010 | Chen |
| 2010/0319981 | A1 * | 12/2010 | Kapusta ............... H05K 9/0024 174/350 |
| 2011/0005662 | A1 | 1/2011 | Sung |
| 2011/0162828 | A1 | 7/2011 | Kirk et al. |
| 2012/0044653 | A1 | 2/2012 | Morris |
| 2012/0243191 | A1 | 9/2012 | Wu |
| 2015/0271911 | A1 | 9/2015 | Chen et al. |
| 2015/0382448 | A1 | 12/2015 | Pennathur et al. |

FOREIGN PATENT DOCUMENTS

| | | |
|---|---|---|
| EP | 0 777 274 A1 | 6/1997 |
| EP | 2 669 942 A2 | 12/2013 |
| EP | 2 713 683 A1 | 4/2014 |
| JP | 2000-163031 A | 6/2000 |
| JP | 2002-342033 A | 11/2002 |
| JP | 2005-109306 A | 4/2005 |
| JP | 2009-301830 A | 12/2009 |
| KR | 10-1200051 B1 | 11/2012 |
| TW | 200420218 A | 10/2004 |
| WO | WO-2013/104274 A1 | 1/2013 |
| WO | WO-2013/066751 A1 | 5/2013 |
| WO | WO-2015/142426 A1 | 9/2015 |
| WO | WO-2015/142427 A1 | 9/2015 |
| WO | WO-2015/199810 A1 | 12/2015 |

OTHER PUBLICATIONS

ROC (Taiwan) Search Report dated Dec. 15, 2015, for TW Application No. 104102913, one page.
ROC (Taiwan) Search Report dated Apr. 12, 2016, for TW Application No. 104103062, with English translation, two pages.
Non-Final Office Actin dated Jun. 17, 2016, for U.S. Appl. No. 14/503,067, filed Sep. 30, 2014, 12 pages.
Non-Final Office Action dated Sep. 13, 2016, for U.S. Appl. No. 14/308,463, filed Jun. 18, 2014, 14 pages.
International Search Report dated Apr. 21, 2015, for PCT Application No. PCT/US2015/013610, filed Jan. 29, 2015, four pages.
International Search Report dated Apr. 21, 2015, for PCT Application No. PCT/US2015/013615, filed Jan. 29, 2015, four pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Final Office Action dated Jan. 9, 2017, for U.S. Appl. No. 14/503,067, filed Sep. 30, 2014, twelve pages.
Final Office Action dated Feb. 8, 2017, for U.S. Appl. No. 14/308,463, filed Jun. 18, 2014, 15 pages.
Non-Final Office Action dated Apr. 25, 2017, for U.S. Appl. No. 14/503,067, filed Sep. 30, 2014, eight pages.
Non-Final Office Action dated May 25, 2017, for U.S. Appl. No. 14/308,463, filed Jun. 18, 2014, 14 pages.
Notice of Allowance dated Jul. 28, 2017, for U.S. Appl. No. 14/503,067, filed Sep. 30, 2014, five pages.

* cited by examiner

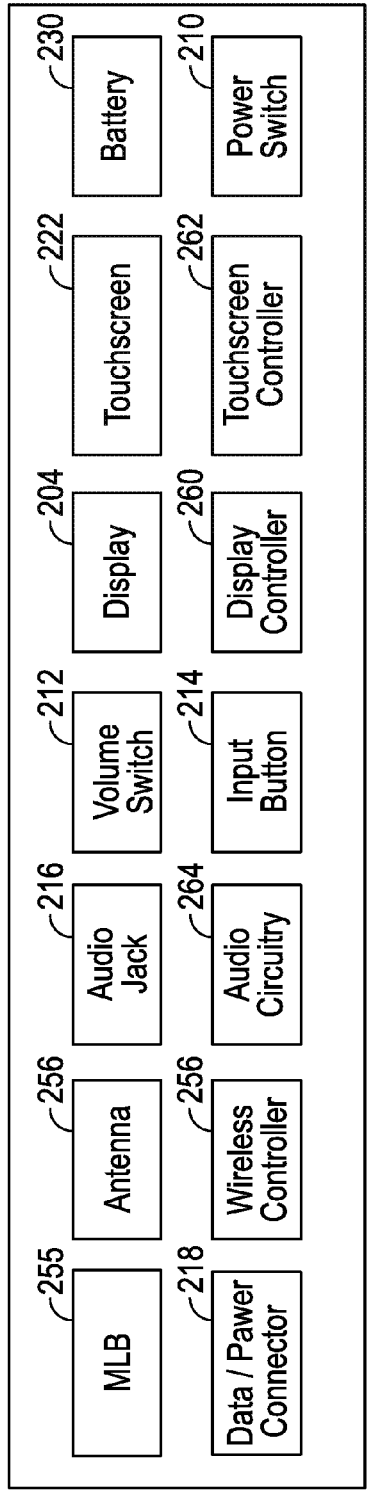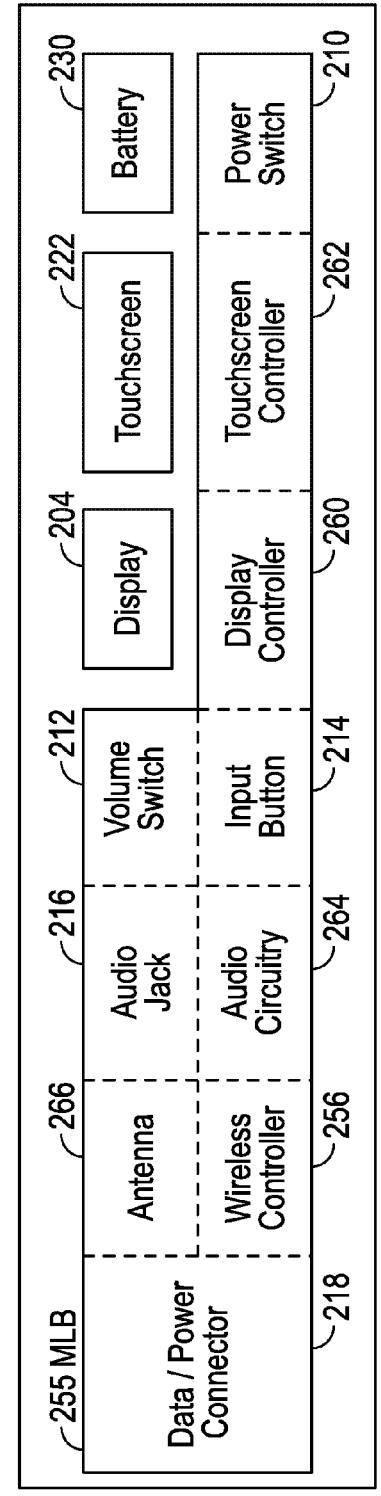

SHIELDING STRUCTURES FOR SYSTEM-IN-PACKAGE ASSEMBLIES IN PORTABLE ELECTRONIC DEVICES

FIELD

This relates generally to mitigating interference and, more particularly, to electromagnetic shielding structures that help isolate components in System-In-Package assemblies from interference in compact portable electronic devices.

BACKGROUND

Compact portable electronic devices are becoming increasingly popular. Examples of compact portable electronic devices include laptop computers, tablet computing devices, cellular telephones, media players, gaming devices, handheld devices, miniature devices such as pendant and wearable devices, and other devices. It is generally desirable to reduce the size of compact portable electronic devices; however, these devices often include circuitry that requires electromagnetic shielding. For example, some electronic devices include radio-frequency transceiver circuits that are susceptible to radio-frequency interference. Electronic devices can also include memory and other components that use clock signals during normal operation. If care is not taken, signals from one circuit can interfere with the proper operation of another circuit. For example, a clock signal or a clock signal harmonic that falls within the operating band of a radio-frequency receiver can cause undesirable interference for a radio-frequency transceiver.

To protect devices from electromagnetic interference, circuits such as radio-frequency transceivers can be enclosed within metal shielding cans, or a conductive paste can be disposed between the circuits. The metal of the shielding cans or the conductive paste can block signals and can help shield the enclosed components from electromagnetic interference. To reduce the size of compact portable electronic devices, the circuitry can be integrated into a System-in-Package. However, shielding cans and conductive paste can limit the effectiveness of the shielding and can limit the size of the device.

SUMMARY

This relates to a compact portable electronic device and shielding structures for System-in-Package assemblies. The compact portable electronic device can be assembled into a single package to reduce size and enhance form factor. Several tens or hundreds of electrical, optical, and mechanical components including multiple dies, passive components, mechanical or optical components can be packaged in a single system on a printed circuit board. Components can be grouped and arranged into subsystems based on their functionality. Interference between subsystems or from external sources can be reduced or eliminated by disposing an insulating layer over the components, forming narrow trenches between subsystems, and conformally coating the insulating layer and trenches with a metal shielding layer.

BRIEF DESCRIPTION OF THE DRAWINGS

FIG. 2B illustrates a block diagram of an exemplary portable device.

FIG. 2C illustrates a block diagram of an exemplary portable device assembled into a System-in-Package.

DETAILED DESCRIPTION

Figure 1A:
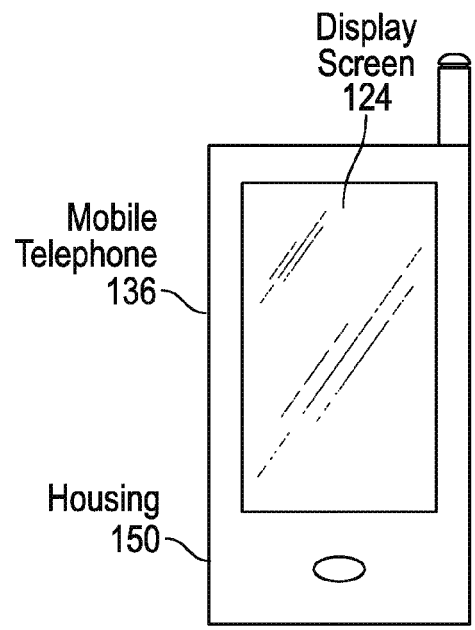
FIGS. 1A-1D illustrate example systems in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

This relates to shielding structures for electrical, mechanical, and optical components and subsystems in a portable electronic device assembled using System-in-Package (SiP) technology. The shielding structures can include, but are not limited to, radio-frequency shielding structures and/or magnetic shielding structures. Shielding structures can shield components such as integrated circuits that operate in radio-frequency bands (e.g., transceiver integrated circuits, memory circuits and other circuits). Components can also include circuitry formed from one or more discrete components such as inductors, capacitors, resistors, switches, etc. The components that are shielded can be aggressors (components that produce radio-frequency or magnetic shield interference) and/or victims (components that are sensitive to interference that is received from external sources). The shielding structures can help to reduce electromagnetic interference and can therefore sometimes be referred to as electromagnetic interference (EMI) shielding structures.

In recent years, portable electronic devices such as laptops, tablet computing devices, cellular telephones, media players, gaming devices, handheld devices, miniature devices, etc., have become small, light and powerful. One factor contributing to this reduction in size can be attributed to the manufacturer's ability to fabricate various components of these devices in smaller and smaller sizes while, in some cases, increasing the power and/or operating speed of such components. Another factor contributing to the reduction in size is that from a visual standpoint, users often find compact and sleek designs of portable electronic devices more aesthetically appealing and thus demand compact and sleek designs. The trend for smaller, lighter, more compact and powerful presents continuing challenges in the design of portable electronic devices and their associated components.

One area that enables small and compact devices can be internal packaging. A particular device can have a desired form factor and functionality. The desired form factor determines a size of the housing in which all of the device components that provide the desired functionality are packaged. The internal packaging design involves minimizing any unused dead space that does not contribute in some way to the functioning of the device while still fitting the needed components in an allotted space dictated by the form factor.

Electrical, mechanical, and optical components can be included in one or more subsystems and packaged using the System-in-Package (SiP) technology. SiP is a functional system assembled into a single package. Several tens or hundreds of components including multiple dies, passive components, and mechanical or optical components can be packaged in a single system on a printed circuit board (PCB). The PCB can be formed from rigid PCB materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails). PCBs on which components such as integrated circuit components and discrete components are mounted can sometimes be referred to as main logic boards (MLBs). The components can be mounted on the PCB using solder or other suitable mounting arrangements. For example, the components can be surface-mount technology (SMT) components that are mounted directly onto a PCB. SiP can lead to higher volumetric efficiency, superior reliability, higher performance, and smaller form factor.

PCBs having shielded components can be used in electronic devices such as desktop computers, computers built into computer monitors, television set top boxes, audio-video equipment, and portable electronic devices such as laptop computers, tablet computing devices, cellular telephones, media players, gaming devices, handheld devices, miniature devices such as pendant and wristwatch devices, or other electronic equipment.

Figure 1B:
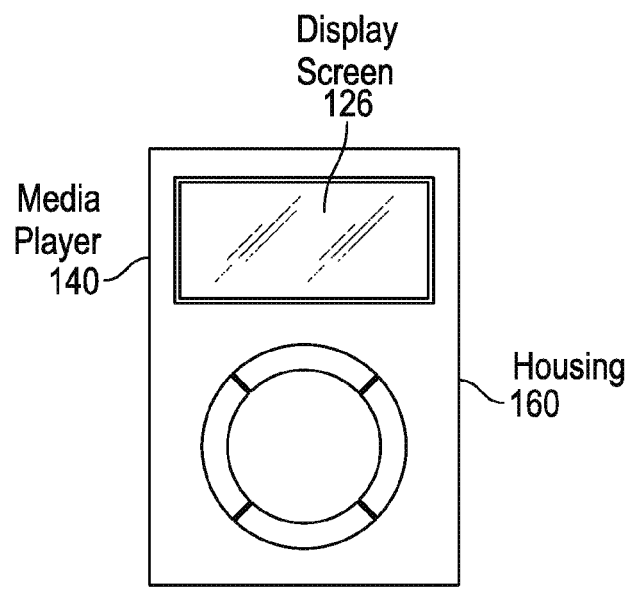
Figure 1C:
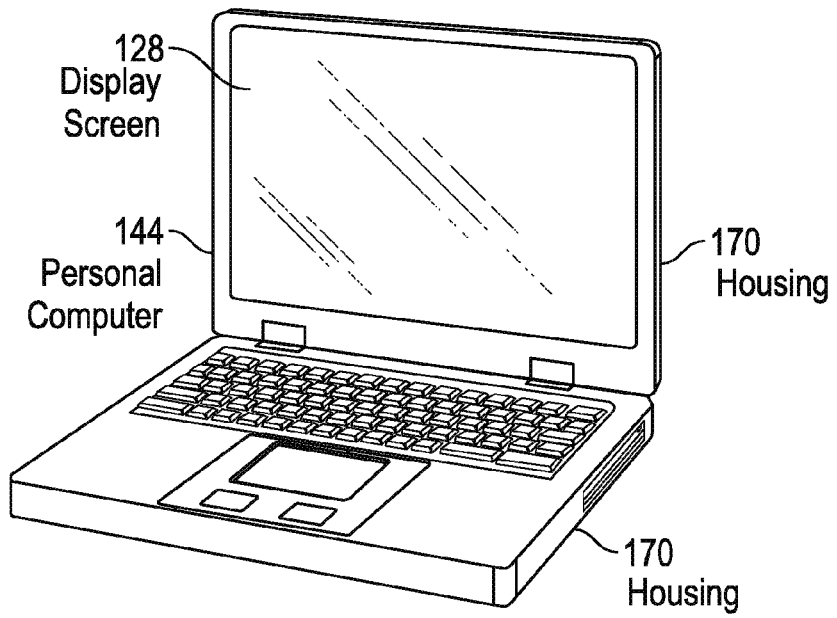
Figure 1D:
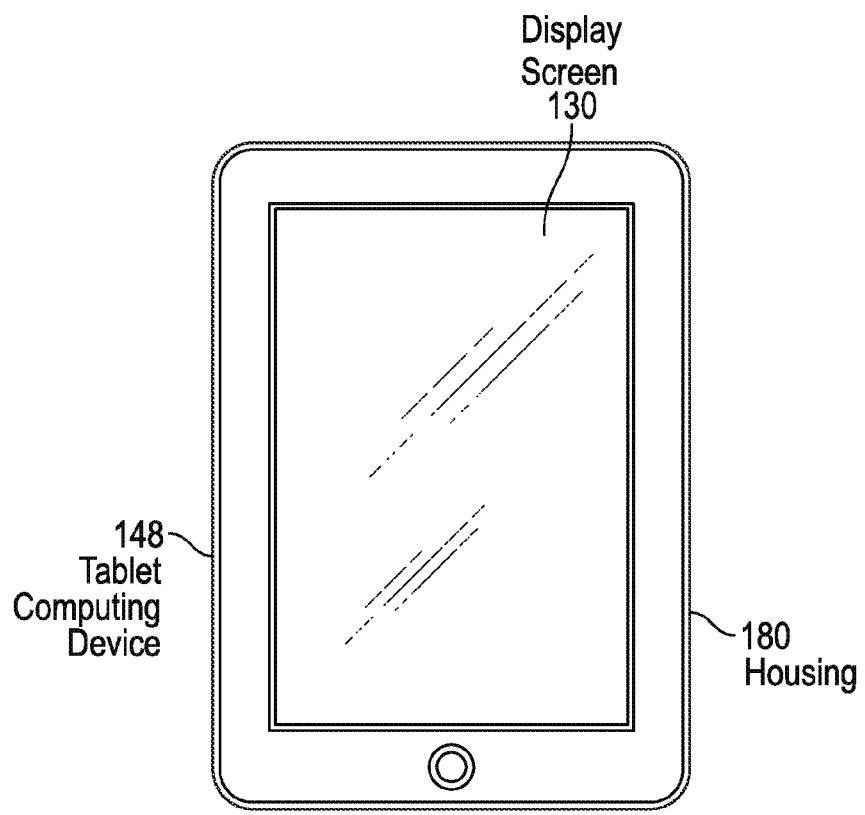

FIGS. 1A-1D illustrate systems in which examples of the disclosure can be implemented. FIG. 1A illustrates an exemplary mobile telephone 136 that includes a display screen 124 packaged in housing 150. FIG. 1B illustrates an exemplary digital media player 140 that includes a display screen 126 packaged in housing 160. FIG. 1C illustrates an exemplary personal computer 144 that includes a display screen 128 packaged in housing 170. FIG. 1D illustrates an exemplary tablet computing device 148 that includes a display screen 130 packaged in housing 180.

Figure 2A:
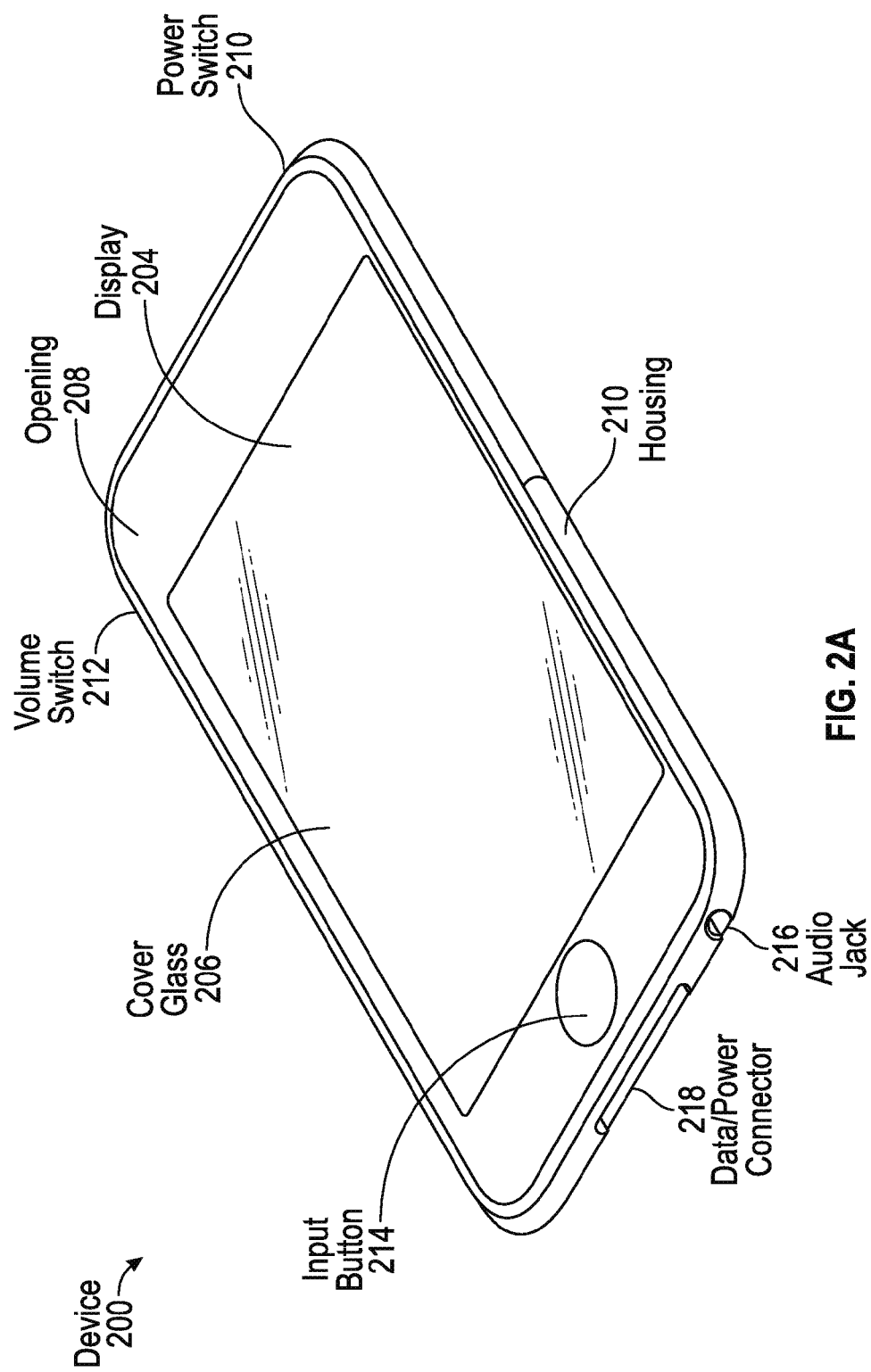
FIG. 2A illustrates a perspective view of an exemplary portable electronic device.

FIG. 2A illustrates a perspective view of an exemplary portable electronic device. Portable electronic device 200 can include a housing 210 with an opening 208. A display 204 surrounded by a frame can be positioned within the opening 208. Display circuitry for the display 204 can be located within the housing 210, such as directly below the display 204. The positioning of the display circuitry can affect the internal spaces that are available within the housing 210.

A touch screen can be associated with the display 204. Circuitry associated with the touch screen, such as touch screen controller, can be located within the housing 210. The display 204 can be sealed via a cover glass (or other material) 206. One or more input buttons, such as input button 214, can be positioned in an opening of the cover glass 206. Detection circuitry associated with the input button 214 can be located within the housing 210. In some examples, the input button 214 can be used to return the device 200 to a particular state, such as a home state.

A number of input/output mechanisms can be located around the edges of the housing. For instance, a data/power connector 218 and audio jack 216 can be located on a bottom edge of the housing 210 and a power switch 210 can be located on a top edge of the housing 210. Housing 210 can also include openings for speakers and/or microphones. Circuitry supporting these components can be packaged internally within the housing 210. The circuitry can be embodied on various circuit boards or on a single circuit board, such as in System-in-Package assemblies, disposed within the housing.

An exemplary block diagram of device 200 is shown in FIG. 2B. The components described above can be controlled by a processor on a MLB 255. Various internal connections can be provided that allow data to move between the MLB 255 and the various components. The routing of internal data connections can depend on how various components are packaged, including where the MLB 255 can be positioned within the housing 210 and available internal pathways that result after the positioning of the various internal device components.

In regards to data connections, MLB 255 can be connected to a display controller 260, which can be coupled to display 204 (shown in FIG. 2A). Further, the MLB 255 can be coupled to audio components, such as a speaker, the audio jack 216 (shown in FIG. 2A), a microphone or associated audio circuitry 264 including an audio codec. Further, the MLB 255 can be coupled to the various input devices, such as touch screen 222 coupled to a touch screen controller 262, the input button circuitry, and the power switch circuitry. In addition, the MLB 255 can be connected to various data interfaces that allow it to receive and send external data, such as the wireless controller 256, which can include an antenna 266, and the data/power connector 218.

Besides data connections, many internal device components can receive power from an internal power source, such as battery 230. For instance, the battery 230 can be coupled to the MLB 255, the display 204, the display controller 260, the touch screen 222, and the data/power connector 218. Like the data connections, the routing of the power connections can depend on the positioning of the various internal device components, such as the battery 230 and the available internal pathways within the housing 210.

An exemplary block diagram of device 200 is shown in FIG. 2C. Various circuitry included in device 200 as described above can be packaged into a single package or a SiP assembly. Several tens or hundreds of electronic components including multiple dies, passive components, and mechanical or optical components can be packaged in a single system on a PCB. Antenna 266, audio jack 216, volume switch 212, data/power connector 218, wireless controller 256, audio circuitry 264, input button 214, display controller 260, touch screen controller 222, and power switch 210 can be included on the MLB 255. Packaging of the components into a SiP assembly can lead to a thinner, more compact, and sleeker device 200.

Figure 3:
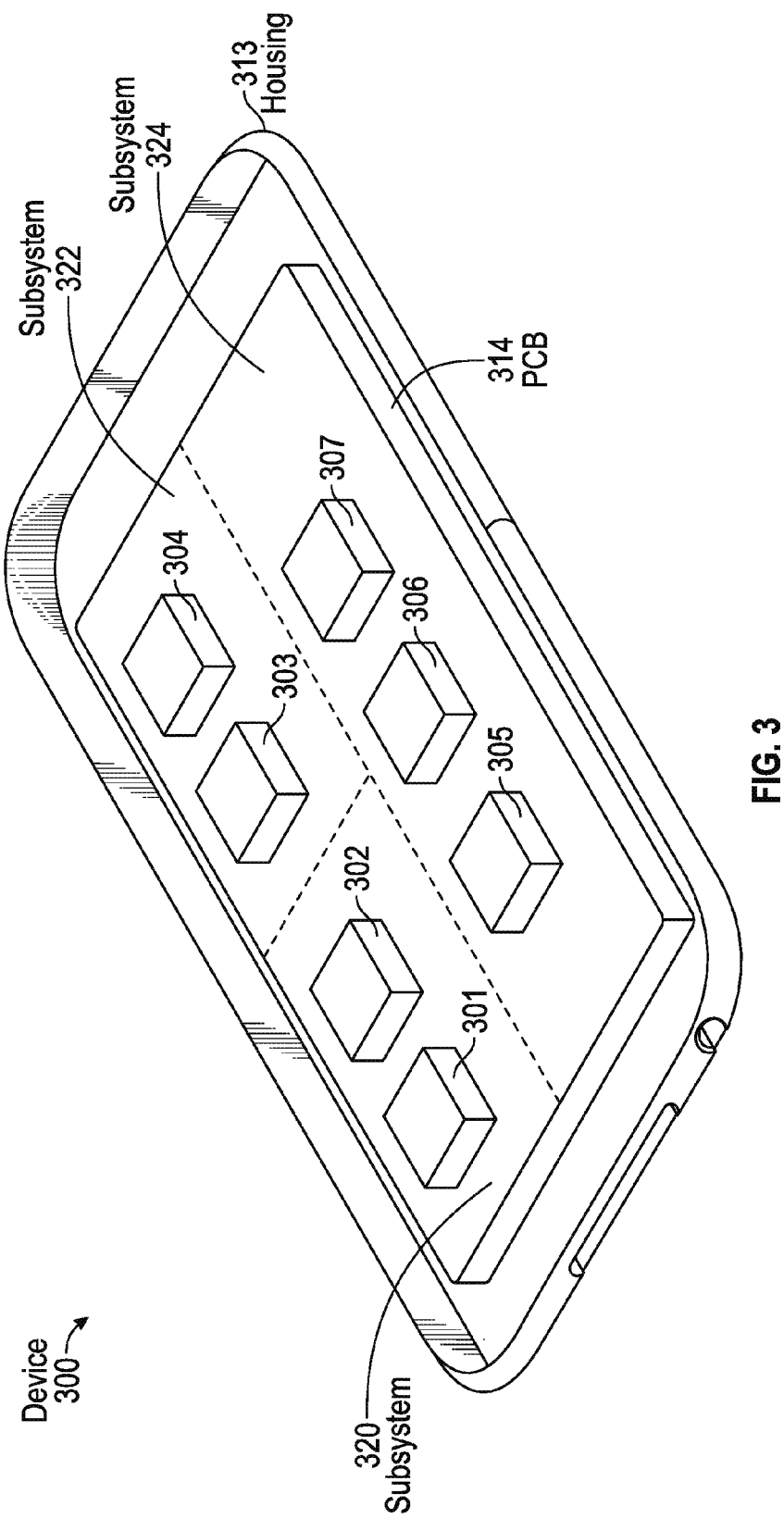
FIG. 3 illustrates a perspective view of an exemplary compact portable electronic device that includes components.

FIG. 3 illustrates a perspective view of an exemplary compact portable electronic device that includes components. Portable electronic device 300 can include housing 313. Housing 313 can be formed from metal, plastic, fiber-composite materials such as carbon fiber materials, glass, ceramics, other materials, or combinations of these materials. Housing 313 can be formed from a single piece of machined metal (e.g., using a unibody-type construction) or can be formed from multiple structures that are attached together such as an internal housing frame, a bezel or band structure, housing sidewalls, planar housing wall members, etc. Device 300 can include components 301-307 mounted on a PCB 314 within housing 313. Components 301-307 can include integrated circuits such as general purpose processing units, application-specific integrated circuits, radio-frequency components such as wireless transceivers, clock generation and distribution circuits, or other components such as discrete components. PCB 314 can be a MLB or other types of logic boards.

Some of the components 301-307 can be sensitive to EMI. For example, a wireless transceiver component can be sensitive to radio-frequency harmonics from a system clock generation component. Some of the components 301-307 can produce radio-frequency signal interference (e.g., a cellular transceiver can emit radio-frequency signals that affect other components of device 300). Other components can generate magnetic interference (e.g., inductors in a power management system can generate magnetic fields). To ensure that the components of device 300 operate properly, it can be desirable to electromagnetically shield one or more components 301-307 on PCB 314 from each other (e.g., by covering components 301-307 with shielding structures).

Components can be grouped into different subsystems based on their functionality. For example, components 301-302 can be included in subsystem 320, components 303-304 can be included in subsystem 322, and components 305-307 can be included in subsystem 324. As an example, subsystem 320 can be designated for wireless communications and subsystem 322 can be designated for audio. It can be desirable to shield a wireless communications integrated circuit located in subsystem 320 to help insure that system noise (e.g., from clocks or other noise sources) does not interfere with proper receiver operation. It can also be desirable to shield an audio circuit located in subsystem 322 so that the audio circuit does not pick up noise from another circuit on device 300 or to shield memory circuits and processor components so that their clocks do not cause interference with other components. In some examples, it can be desirable to shield a group containing multiple components (e.g., when the components are sensitive to EMI from external sources).

Figure 4:
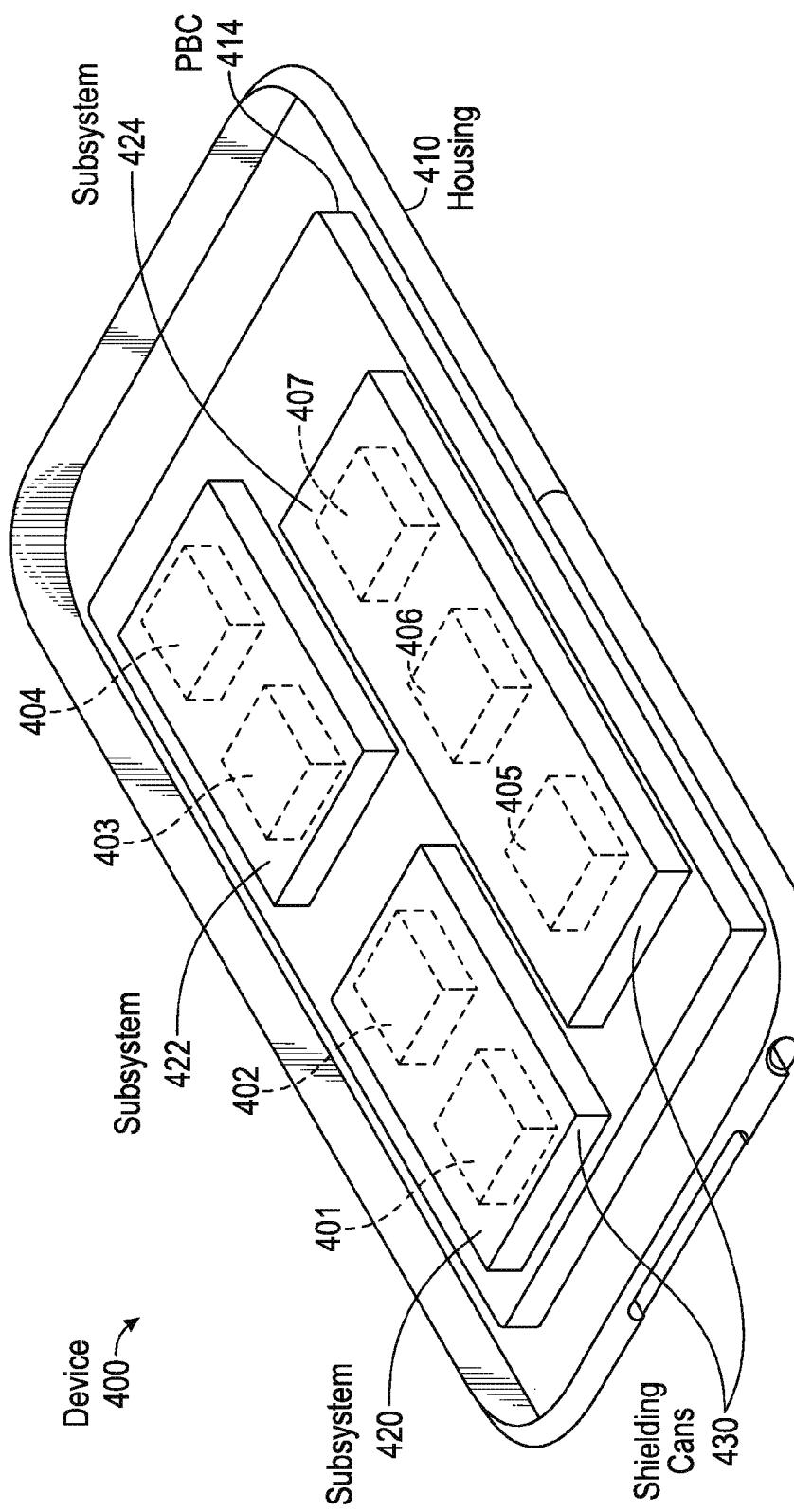
FIG. 4 illustrates an exemplary portable electronic device with metal cans used for shielding.

FIG. 4 illustrates an exemplary portable electronic device with metal shielding cans used for shielding. Portable electronic device 400 can include a PCB 414 enclosed within housing 410. Components 401-407 can be mounted or disposed on the PCB 414. Components 401-402 can be included in subsystem 420, components 402-403 can be included in subsystem 422, and components 404-407 can be included in subsystem 424. Shielding cans 430 can be used to cover components within a particular subsystem from either internal interference, external interference, or both. Shielding cans 430 can be soldered onto the PCB 414 either during or after mounting the components to the PCB 414. In some examples, the shielding cans can be made of a metal sheet or a foil.

One problem with the shielding cans can be that the shielding cans can occupy a significant portion of board space. Additionally, the sheet thickness of the material used for the shielding cans and additional clearance gap required above the shielding cans can lead to thicker, more bulky devices.

Figure 5A:
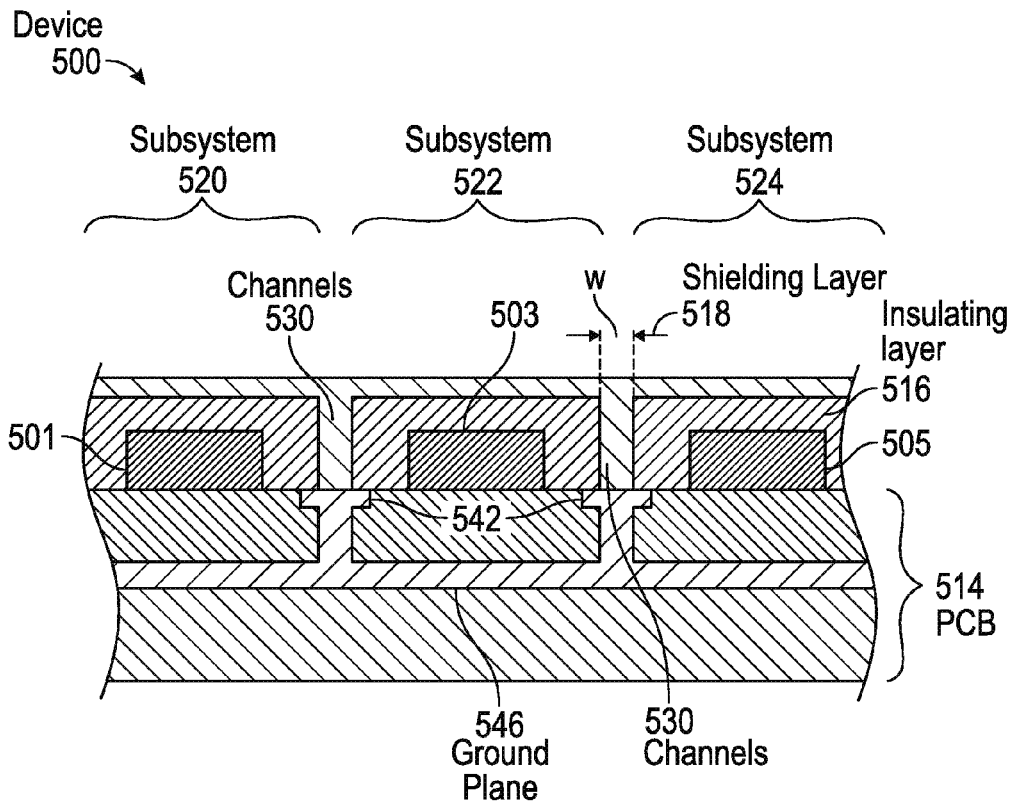
FIG. 5A illustrates a cross-sectional view of an exemplary portable electronic device with conductive paste used for shielding.

FIG. 5A illustrates a cross-sectional view of an exemplary portable electronic device with conductive paste used for shielding. Portable electronic device 500 can include a substrate or PCB 514. Components 501, 503, and 505 can be mounted or disposed on the PCB 514 using any mounting technique. Shielding structures can include an insulator or insulating layer 516 and a shielding or shielding layer 518. Shielding structures can be disposed on components 501, 503, and 505 and can selectively shield components 501, 503, and 505 from internal and/or external interference. Insulating layer 516 can be used to prevent electrical shorting between the shielding layer 518 and any conductive materials on PCB 514 (e.g., conductive portions of components 501, 503, and 505).

Insulating layer 516 can be formed from epoxy, over-molding materials, under-fill materials, heat shrink jackets, acrylic materials, dielectric materials, thermoset materials, thermoplastics, rubbers, plastics, or other desirable materials that provide electrical insulation. In some examples, insulating layer 516 can be formed using insulating materials that are electrically insulating and thermally conductive. For example, insulating material can include thermally conductive plastics, epoxy, or other thermally conductive materials. Insulating materials that are thermally conductive can be used to draw heat away from components 501, 503, and 505. For example, a radio-frequency transceiver can become undesirably hot during normal operation. In this scenario, it can be desirable to form shielding structures from insulating materials that are thermally conductive to help protect the radio-frequency transceiver from overheating. In some examples, insulating layer 516 can be used to form configurations that can include subsystems for selected components on a substrate. In some examples, insulating layer 516 can be used to form configurations that provide structural support for shielding layer 518.

Shielding layer 518 can be formed over the insulating layer 516 to shield the underlying components from EMI. Shielding layer 518 can include conductive materials such as silver paint, platinum paint, solder, metals such as copper or aluminum, metal alloys such as nickel-iron alloys, conductive adhesives, or other materials suitable for electromagnetic shielding. Shielding layer 518 can be formed in various configurations including walls, fences, sheets or layers, combinations of these configurations, or other desired configurations.

PCB 514 can include metal traces 542 and ground plane 546. Shielding layer 518 can electrically couple with metal traces 542 and ground plane 546 to form a shielding structure that encloses each subsystem and helps protect components 501, 503, and 505 from EMI (e.g., interference from external sources or between components of different subsystems). In some examples, metal traces 542 can be formed from conductive materials that help protect the PCB 514 from cutting tools. For example, metal traces 542 can reflect lasers emitted by laser cutting tools.

Figure 5B:
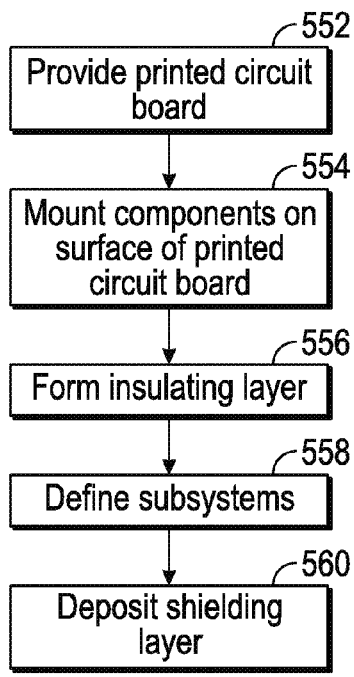
FIG. 5B illustrates a flow diagram for forming an exemplary portable electronic device with conductive paste used as shielding.

FIG. 5B illustrates a flow diagram for forming an exemplary portable electronic device with conductive paste used as shielding. Process flow 550 includes providing a substrate or PCB in step 552. In step 554, the components can be mounted on the surface of the PCB. In step 556, an insulating layer can be formed using an injection process or deposition process. For the injection process, molding tools can be used to mold insulating materials to form the insulating layer and to transfer the molded insulating layer to the PCB. Molding tools can include injection molding tools, sintering tools, matrix molding tools, compression molding tools, transfer molding tools, extrusion molding tools, and other tools suitable for molding insulating materials into a desired configuration. Molding tools can be used to form structures that define the shape and location of the subsystems. For the deposition process, deposition tools can be used to deposit insulating layer at desired locations on the substrate or PCB. Deposition tools can include tools for injecting insulating materials (e.g., epoxy) into injection molding tools to form shielding structures. Deposition tools can also include thin-film deposition tools (e.g., chemical or physical deposition tools) or other tools desirable for forming shielding structures.

In step 558, subsystems can be formed and defined. Each subsystem can enclose its respective components, and can be formed either during the molding process as described above or by scribing or etching a channel using a cutting source. When using a molding process, molding structures (not shown) can have holes through which insulating material can be injected into the space inside the molding structure. After the injection process (e.g., after insulating materials are injected and sufficiently cooled), the molding structures can be removed. The insulating materials can be heated prior and/or during injection using heating tools. Heating tools can include oil-based heating tools, gas-based heating tools, electrical-based heating tools, or any other heating tools suitable for heating insulating materials. Heating tools can, if desired, be used to apply pressure to the insulating layer 516 during formation. In some examples, the insulating layer can be pre-formed and then placed on the PCB over the components. When using a cutting source to define each subsystem, channels can be formed by cutting through the insulating layer using cutting tools to isolate subsystems. Cutting tools can include sawing tools, laser cutting tools, grinding tools, drilling tools, electrical discharge machining tools, or other machining or cutting tools suitable for cutting through the insulating layer.

In step 560, a shielding layer such as a layer of silver paste can be deposited (e.g., using deposition tools) over the insulating layer and inside the channels. The shielding layer can contact metal traces and, in combination with a ground plane, can form shielding structures that help protect components in the subsystems from EMI. In some examples, tools used for forming the insulating layer can also be used for depositing the shielding layer.

One possible problem with conductive paste can be its shielding effectiveness. The conductive paste can be porous and can have limited shielding capabilities due to low conductivity. Additionally, the viscosity of the conductive paste can require the width between subsystems to be wide in order for the conductive paste to fill the channels or the area between subsystems. For example, the width W (see FIG. 5A) of the channels can be about 100 µm-1 mm. Furthermore, the conductive paste can require additional processing steps such as curing and baking that can lead to long manufacturing times.

Figure 6A:
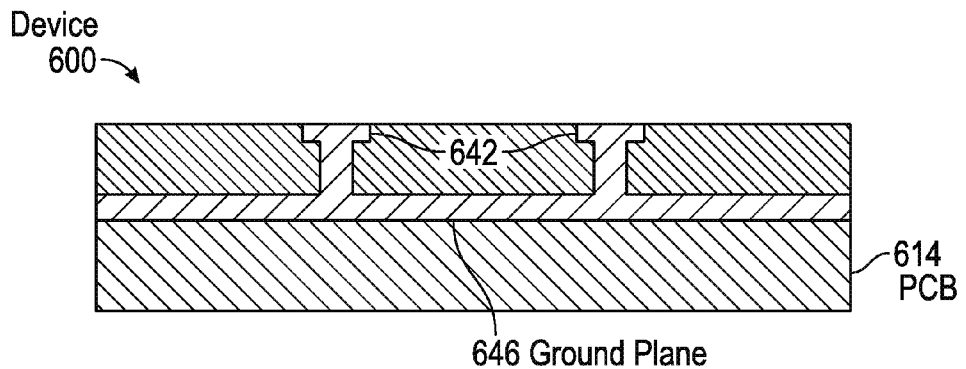
FIGS. 6A-6G illustrate cross-sectional views of an exemplary portable electronic device packaged into a System-in-Package assembly with a plating film used as shielding.

FIGS. 6A-6G illustrate cross-sectional views of an exemplary portable electronic device packaged into a System-in-Package assembly with a plating film used as shielding. Portable electronic device 600 can include a substrate or PCB 614, as shown in FIG. 6A. PCB 614 can include metal traces 642 and ground plane 646. Metal traces 642 and ground plane 646 can be used to electrically connect to a subsequently deposited shielding layer to form shielding structures that enclose the subsystems and help protect components from interference.

Figure 6B:
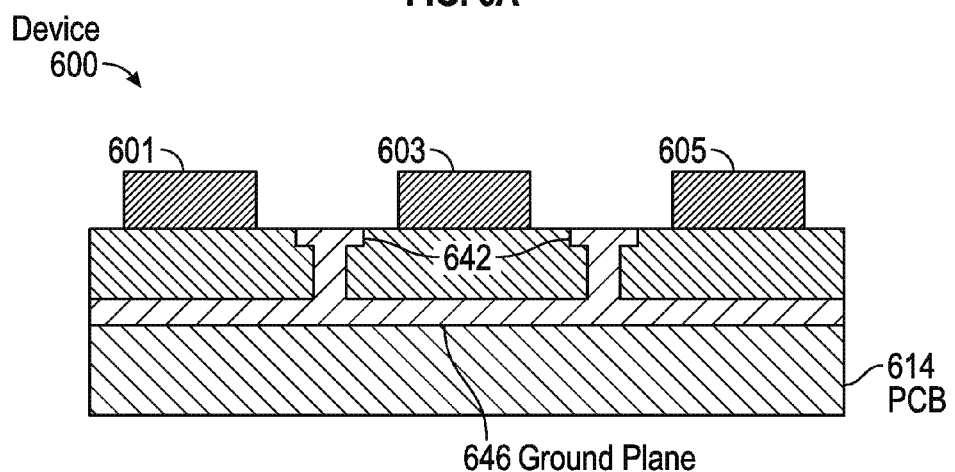
Figure 6C:
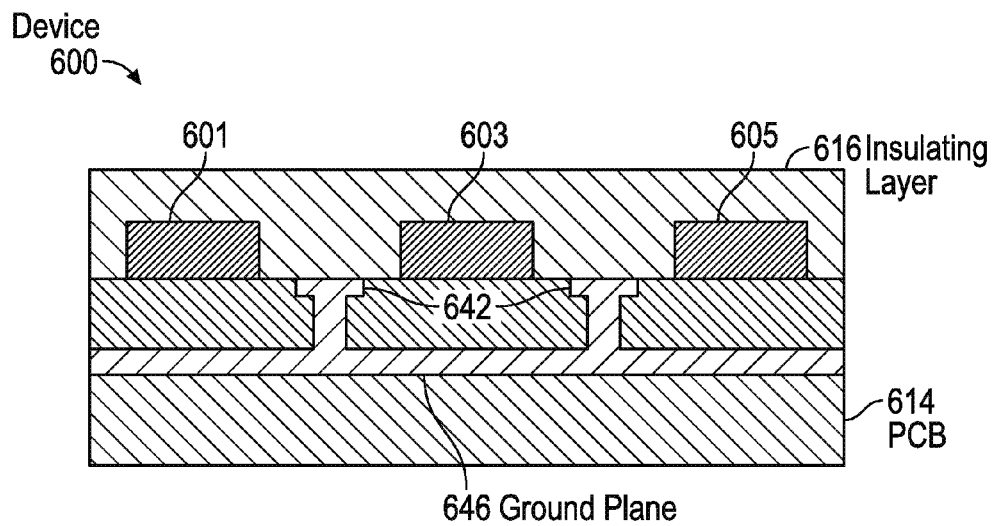

As shown in FIG. 6B, components 601, 603, and 605 can be mounted or disposed on PCB 614 using any mounting technique. The components 601, 603, and 605 can be mounted using solder or any suitable mounting material. As shown in FIG. 6C, insulating layer 616 can be formed on the PCB 614 using either the molding tools or deposition tools as discussed earlier. Insulating layer 616 can be an epoxy, over-molding materials, under-fill materials, heat shrink jackets, acrylic materials, dielectric materials, thermoset materials, thermoplastics, rubbers, plastics, or other desirable materials that provide electrical insulation. In some examples, the insulating layer 616 can be formed by injecting the material into a space inside a molding structure. In some examples, the insulating layer 616 can be deposited using a deposition tool.

Figure 6D:
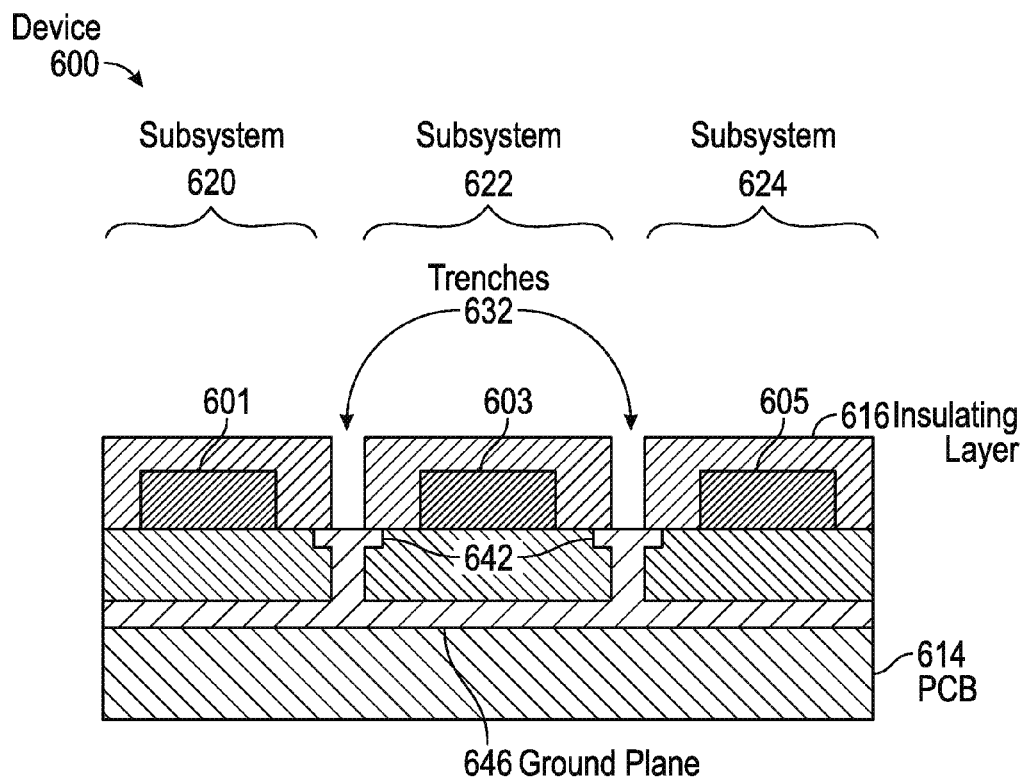
Figure 6E:
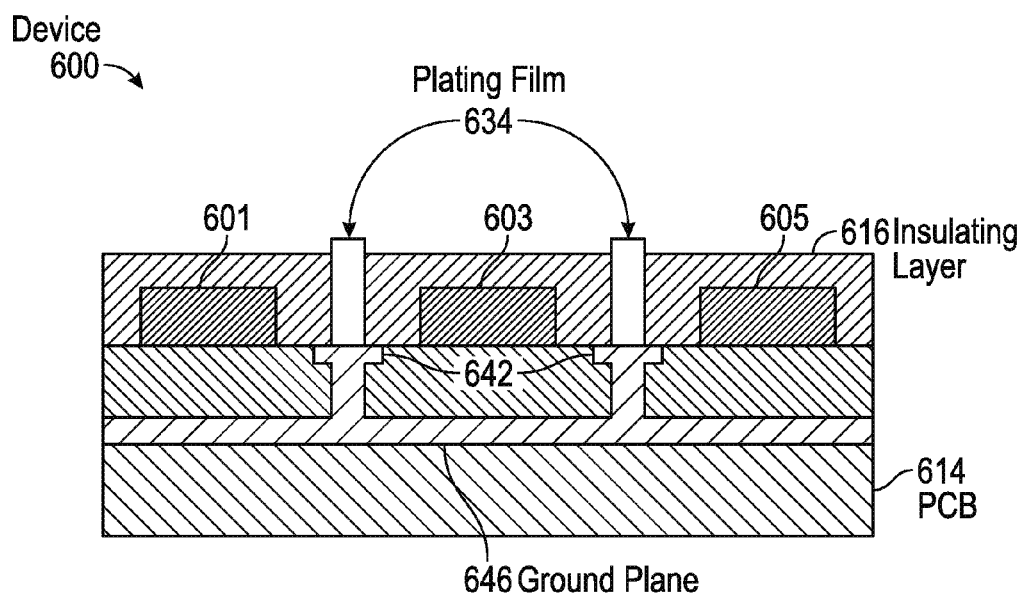
Figure 6F:
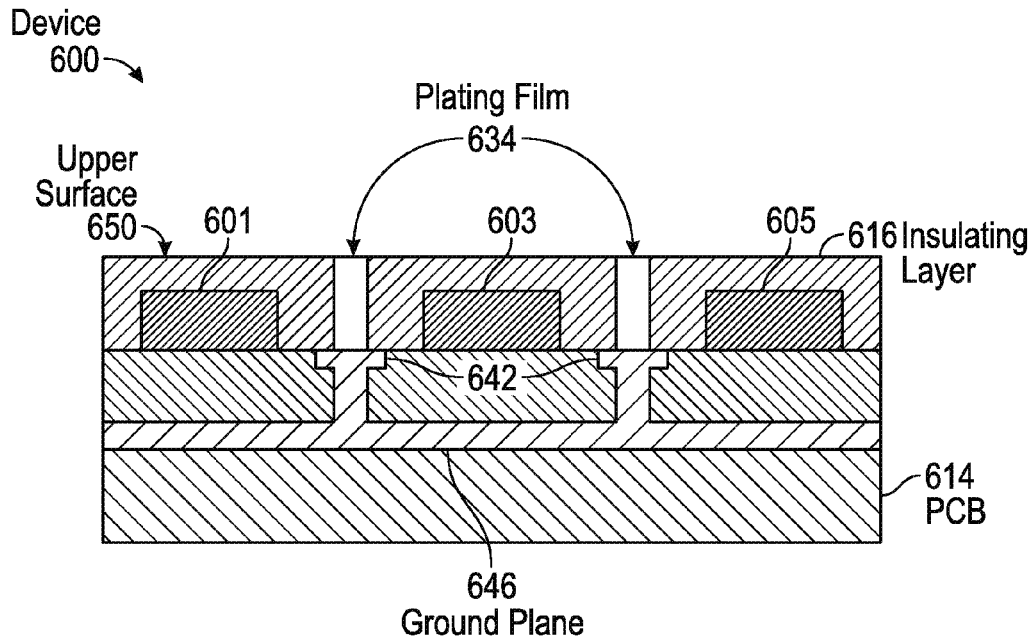
Figure 6G:
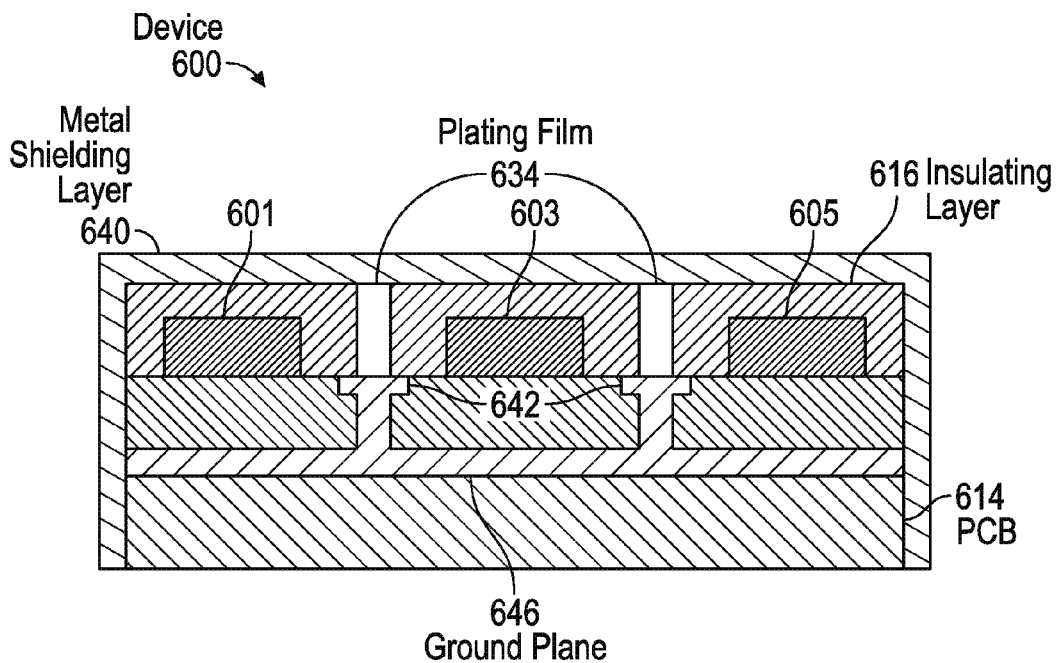

A laser cutting source can form trenches 632 in the insulating layer 616, as shown in FIG. 6D. The trenches 632 can be formed to isolate and define subsystems 620, 622, and 624. Trenches 632 can be filed using a trench shielding layer 634, as shown in FIG. 6E. The trench shielding layer 634 can be a plating film. Exemplary plating films can include, but are not limited to, Copper, Nickel, and Aluminum. The trench shielding layer 634 can be formed using chemical vapor deposition, physical vapor deposition, or electrochemical plating techniques. Optionally, the upper surface 650 can undergo lapping, polishing, or dry etching to remove any excess trench shielding layer, as shown in FIG. 6F. In some examples, the trench shielding layer 634 can cover the walls of the trench without filling the trenches 632.

A conformal metal shielding layer 640 can be deposited over upper surface 650. The material used for the metal shielding layer can include, but is not limited to, Copper, Nickel, and Aluminum. In some examples, the metal shielding layer 640 can be the same material as the trench shielding layer 634. In some examples, the metal shielding layer 640 can be a different material as the trench shielding layer 634. In some examples, the metal shielding layer 640 can conformally cover the sides of PCB 614.

By forming a trench using a laser cutting source and using a plating film, the width of the trench can be made smaller (than the width W of FIG. 5A), thereby reducing the footprint or board space required. For example, the width of the trench of FIG. 6D can be about 10-100 µm. The smaller trenches can lead to not only a reduced required board space, but can also lead to enhanced aesthetic appeal and improved optical uniformity. Additionally, the materials used for the plating films can have a higher density and higher electrical conductivity, resulting in better shielding efficiency compared to the conductive paste.

Figure 7A:
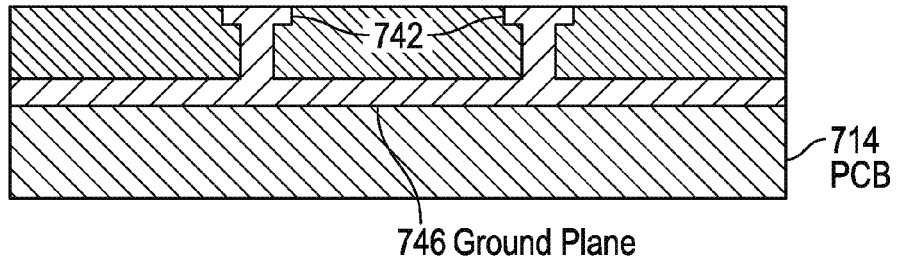
FIGS. 7A-7E illustrate cross-sectional views of an exemplary portable electronic device packaged into a System-in-Package assembly with a plating film used as shielding.

FIGS. 7A-7E illustrate cross-sectional views of an exemplary portable electronic device packaged into a System-in-Package assembly with a plating film used as shielding. Portable electronic device 700 can include a substrate or PCB 714, as shown in FIG. 7A. PCB can include metal traces 742 and ground plane 746. Metal traces 742 and ground plane 746 can be used to electrically connect to a subsequently deposited shielding layer to form shielding structures that enclose the subsystems and help protect components from interference.

Figure 7B:
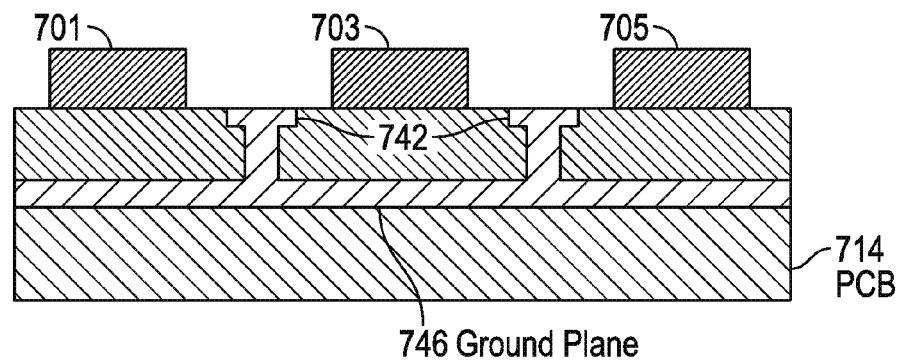
Figure 7C:
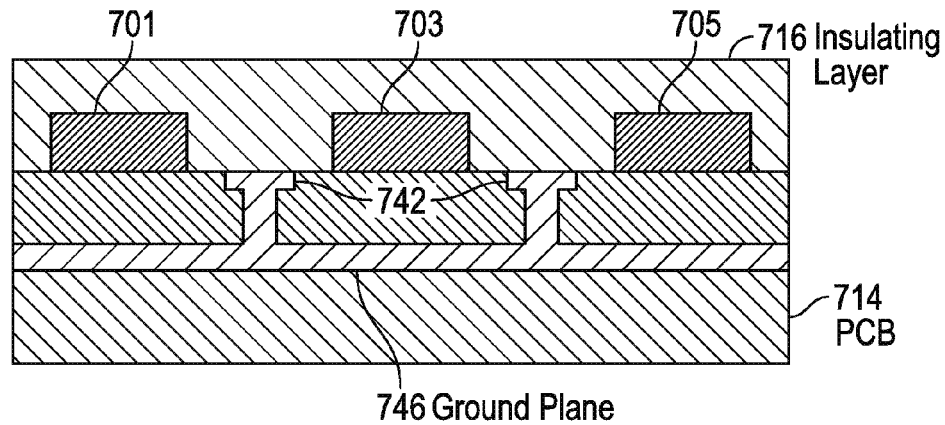
Figure 7D:
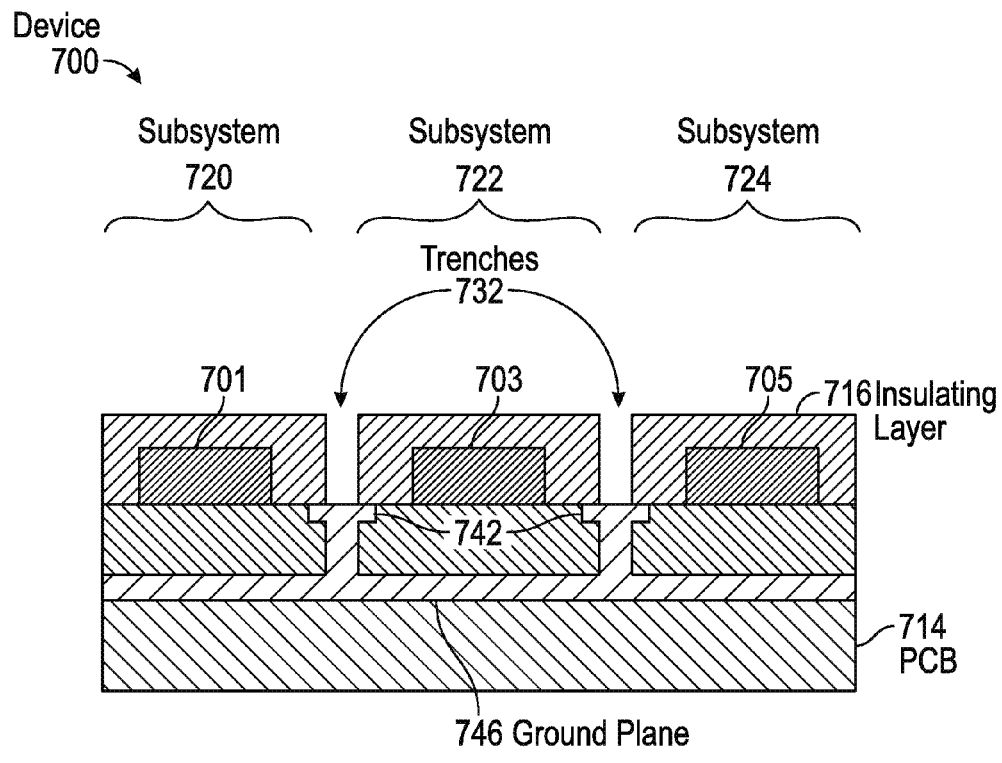
Figure 7E:
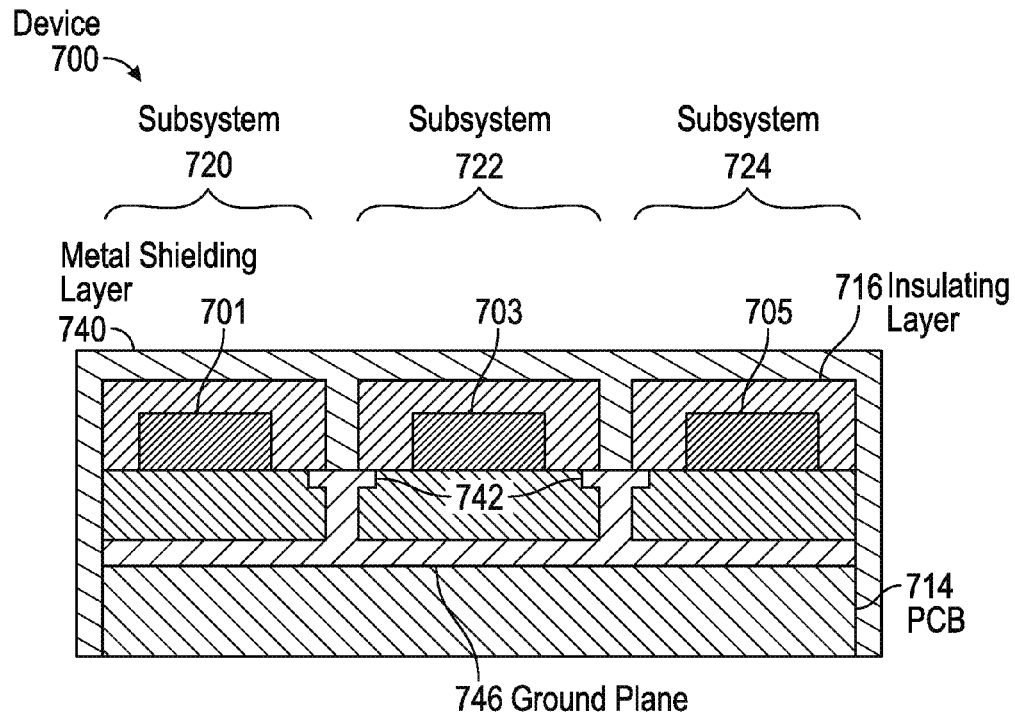

As shown in FIG. 7B, components 701, 703, and 705 can be mounted or disposed on PCB 714 using any mounting technique. Solder or suitable mounting can be used to mount components 701, 703, and 705 to the surface of the PCB 714. As shown in FIG. 7C, insulating layer 716 can be formed on the PCB 714 using any one of the processes discussed earlier such as a molding process or deposition process. As shown in FIG. 7D, a laser cutting source can be used to form trenches 732 in the insulating layer 716. The trenches 732 can isolate and define subsystems 720, 722, and 724. In some examples, other cutting tools can be used. A metal shielding layer 740 can be deposited to fill trenches 732 and conformally cover the subsystems 720, 722, and 724, as shown in FIG. 7E. Materials used for the metal shielding layer 740 can include, but are not limited to, Copper, Nickel, and Aluminum. In some examples, the metal shielding layer 740 can cover the walls of the trench without filling the trenches 732.

In some examples, metal shielding layer 740 can be formed using electroless plating. Electroless plating can produce conformal coatings that are uniform and homogeneous. Additionally, electroless plating can allow for simpler setups and processes, leading to lower manufacturing costs. Furthermore, electroless plating can be used to fill trenches that are deep. The plating films resulting from electroless plating can be less porous, leading to enhanced shielding and better corrosion protection. In some examples, metal shielding layer 740 can be formed using chemical vapor deposition. Chemical vapor deposition can provide good thickness control.

Figure 8A:
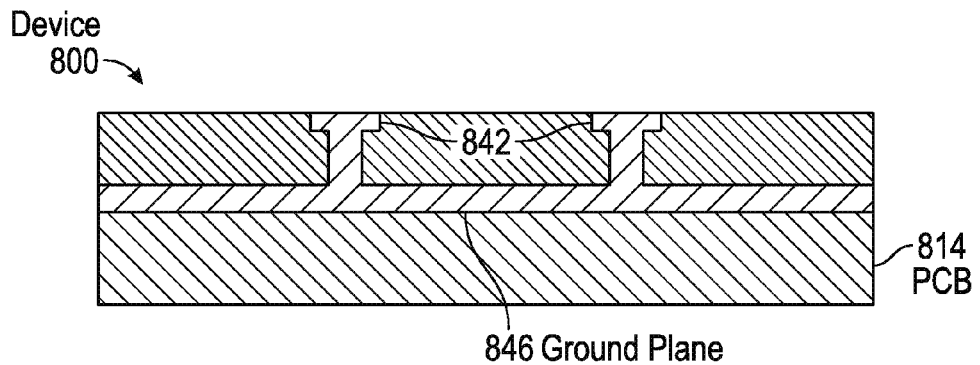
FIGS. 8A-8E illustrate cross-sectional views of an exemplary portable electronic device packaged into a System-in-Package assembly with angled wall trenches.

FIGS. 8A-8E illustrate cross-sectional views of an exemplary portable electronic device packaged into a System-in-Package assembly with a plating film used as shielding. Portable electronic device 800 can include a substrate or PCB 814, as shown in FIG. 8A. PCB 814 can include metal traces 842 and ground plane 846.

Figure 8B:
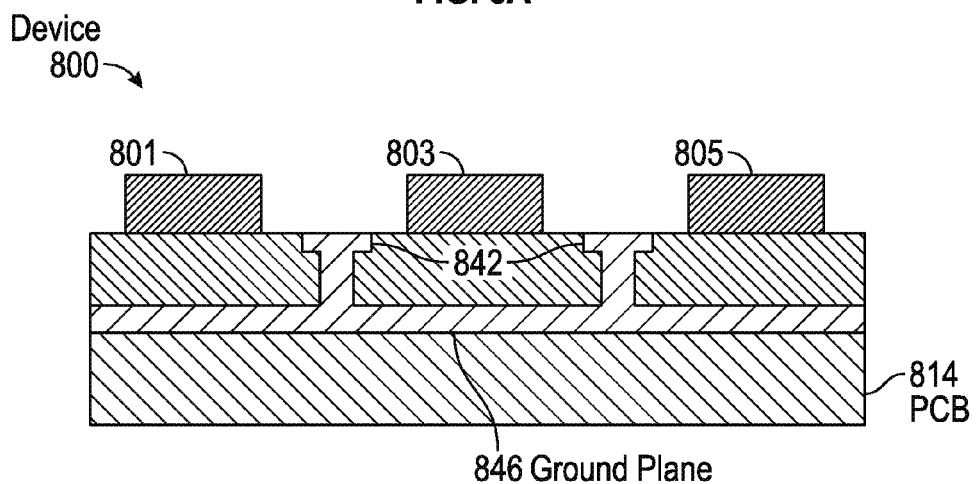
Figure 8C:
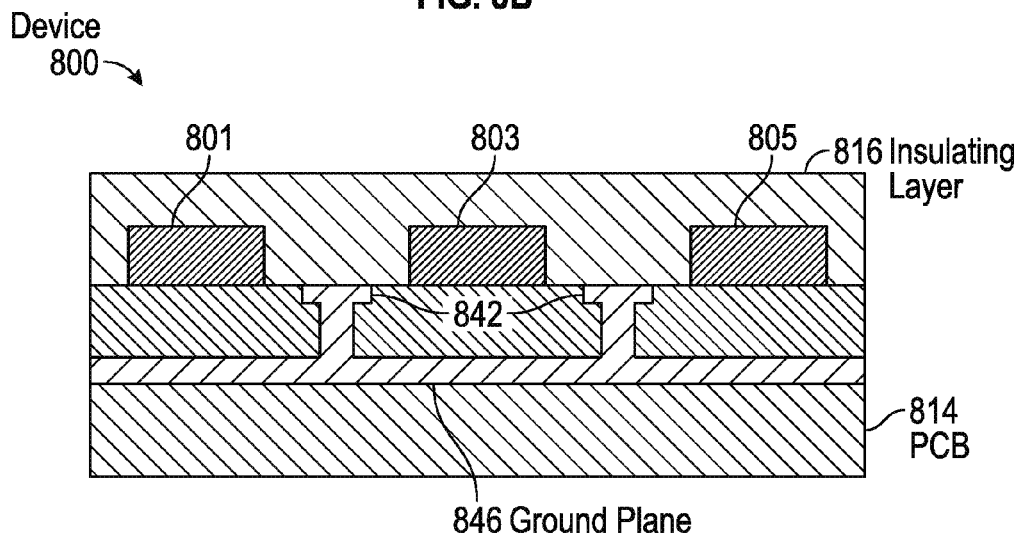
Figure 8D:
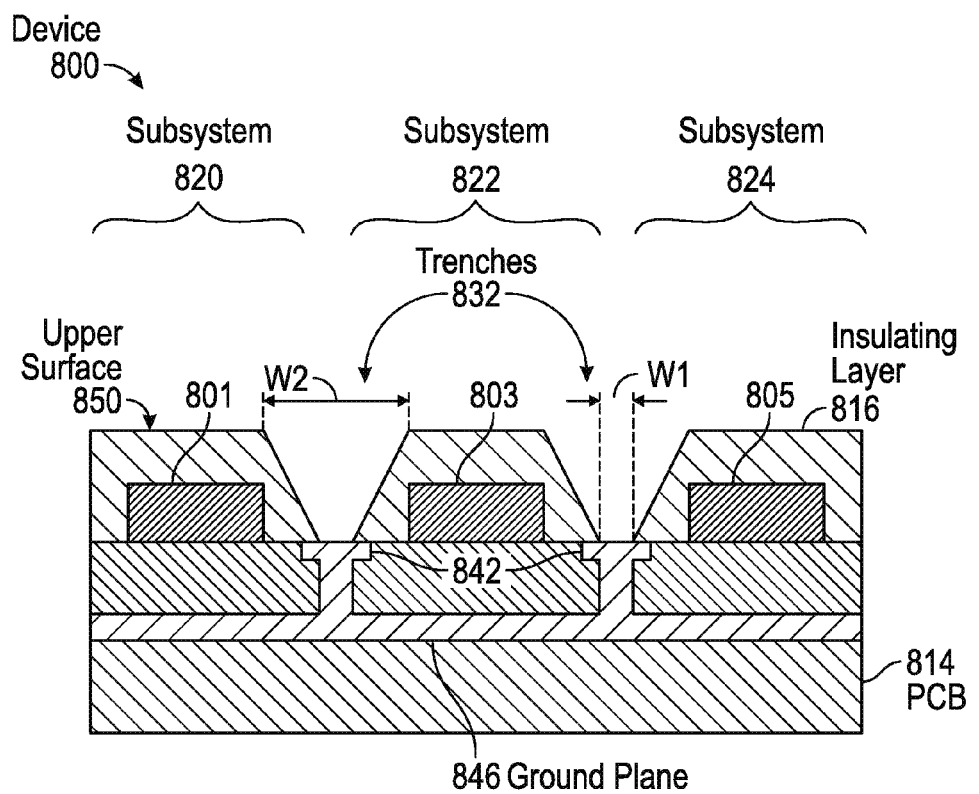
Figure 8E:
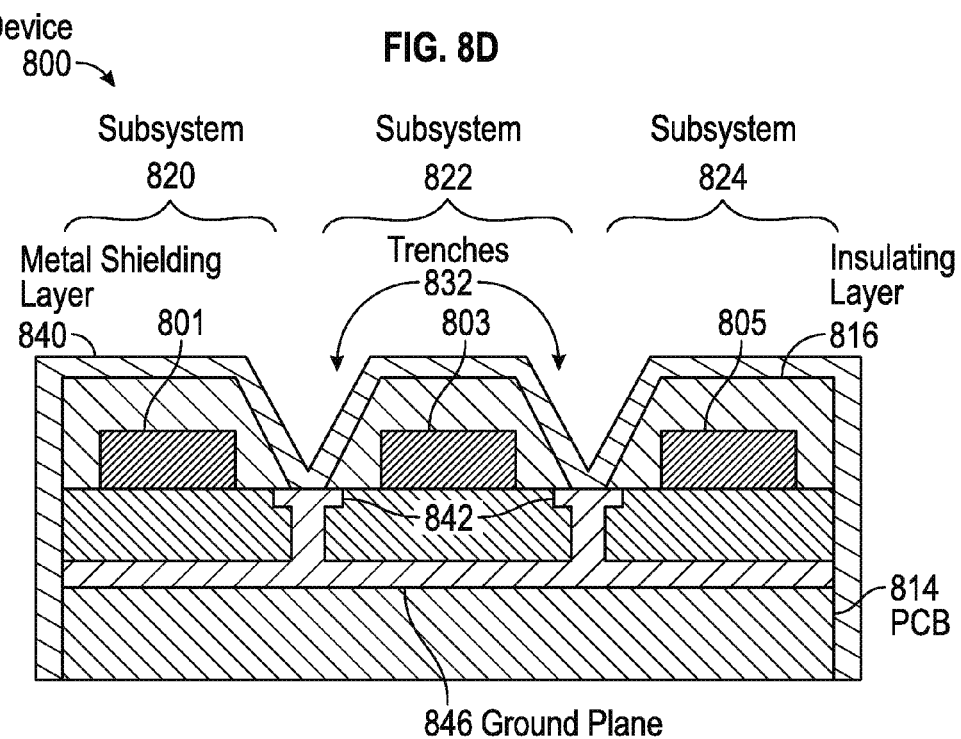

As shown in FIG. 8B, components 801, 803, and 805 can be mounted or disposed on PCB 814 using any mounting technique. Components 801, 803, and 805 can be mounted using solder or any suitable mounting material. As shown in FIG. 8C, insulating layer 816 can be disposed on the components 801, 803, and 805 to prevent electrical shorting between the subsequently formed shielding layer 818 and any conductive materials on PCB 814 (e.g., conductive portions of components 801, 803, and 805). Any material that has sufficient insulating properties can be used for the insulating layer 816, and any number of deposition or molding processes can be used to form the insulating layer 816. A cutting source such as a laser can be used to form trenches 832 in the insulating layer 816. Trenches 832 can isolate and define subsystems 820, 822, and 824. As shown in FIG. 8E, a metal shielding layer 840 can be deposited to fill trenches 832 and conformally cover the insulating layer 816. Metal shielding layer 840 can be any material that has a high density, high conductivity, and good corrosion resistance. In some examples, the metal shielding layer 840 can cover the walls of the trench without filling the trenches 832.

The metal shielding layer 840 can be formed using physical vapor deposition tools. Physical vapor deposition (PVD) can lead to simpler and cheaper manufacturing processes due to the absence of chemicals during the deposition process. Additionally, PVD can allow for a wider selection of metals, better control of film thickness, and higher density films. Furthermore, the insulating layer 814 and metal shielding layer 840 can be deposited in a single integrated system. The ability to deposit the insulating layer 814 and metal shielding layer 840 can lead to lower number of defects or particles in the layers, and hence improved material quality, improved device performance, and higher yields. Deposition of both layers in a single integrated system can also allow for the use of volatile materials for one or more of the insulating layer 814 and metal shielding layer 840.

The trench filling capability can be limited for PVD when the aspect ratios of the trenches are high. One way to alleviate the trench filling capability issue can be to form trench 832 with angled walls, as shown in FIG. 8D. The angled walls of trenches 832 can be formed using any number of techniques such as a laser cutting tool, shadow mask, or dry etching. Trenches 832 can be formed with a first width W1, located near the surface of the PCB 814, and a second width W2, located near the upper surface 850. In some examples, first width W1 can be smaller than the second width W2. In some examples, first width W1 can be between 10-100 μm. In some examples, second width W2 can be between 10-1000 μm. In some examples, second width W2 can be between 100-500 μm.

In some examples, the deposition tool used to deposit the metal shielding layer 840 can be selected based on the trench depth and trench filling. Deposition tools can include, but are not limited to, magnetron sputtering, ion beam deposition, high-power impulse magnetron sputtering, or evaporation. In some examples, deposition process parameters such as substrate bias power can be varied in order to improve the trench filling capability. In some examples, the deposition process can additionally utilize one or more collimators.

Figure 9:
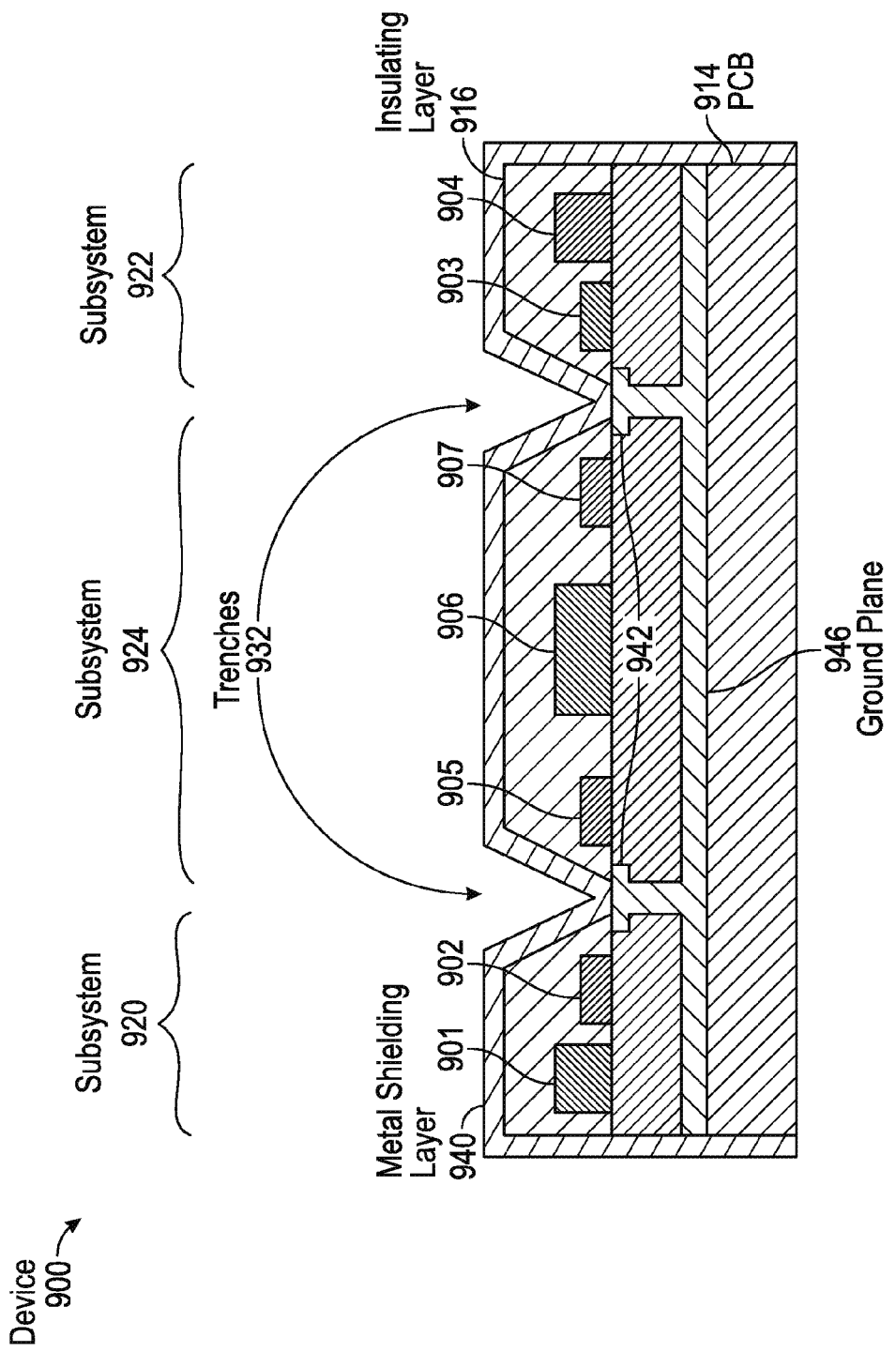
FIG. 9 illustrates cross-sectional views of an exemplary portable electronic device packaged into a System-in-Package assembly arranged in a configuration that occupies substantially a full area of the board.

To conserve space, the components can be arranged in a configuration that occupies substantially a full area of the PCB while the insulating layer and metal shielding layer are spaced such that subsystems are electrically isolated and shielded from one another. FIG. 9 illustrates cross-sectional views of an exemplary portable electronic device packaged in a System-in-Package assembly and arranged in a configuration that occupies substantially a full area of the board. Device 900 comprises a PCB 914 with metal traces 942 and ground plane 942. Components 901-907 are mounted on PCB 914, and an insulating layer 916 can be disposed on components 901-907. In some examples, components 901-907 are arranged in close proximity to components in their respective subsystems. For example, components 901 and 902 are included in subsystem 920 and arranged in close proximity to one another. Similarly, components 903 and 904 are included in subsystem 922, components 905-907 are included in subsystem 924, and the components are arranged based on their subsystem. Trenches 932 are formed in the insulating layer 916 to isolate subsystems 920, 922, and 924. Metal shielding layer 940 can be disposed on insulating layer 916. In the illustrated exemplary configuration, the trenches 932 were formed with angled walls. In such a configuration, one way to occupy substantially a full area of the board space can be to place lower profile components closer to the trenches 932. For example, component 902 has a lower profile than component 901, and therefore component 902 is arranged closer to the trench 932 than component 901. Without such an arrangement, a larger footprint can be needed in order to achieve the appropriate angles for the angled walls of trench 932. Similarly, component 903 can have a lower profile than component 904, and components 905 and 907 can have a lower profile than component 906. Thus, components 903, 905, and 907 can be arranged closer to the trenches 932 than components 904 and 906.

In one or more of the examples above, the metal traces and/or ground plane are not included in the substrate or PCB. In some examples, the metal traces and ground plane can be located on the same layer as the components. In some examples, the metal traces and ground plane can be located on the outer edges of the device.

In some examples, an electronic device is disclosed. The electronic device may comprise a substrate; and a system in package assembly including a plurality of components mounted on the substrate, one or more subsystems, each subsystem including one or more of the plurality of components, and a first shielding disposed between the one or more subsystems. Additionally or alternatively to one or more examples disclosed above, in other examples, the substrate further comprises: one or more metal traces; and a ground plane, wherein the one or more metal traces are electrically connected to the ground plane and the first shielding. Additionally or alternatively to one or more examples disclosed above, in other examples, a spacing between one or more subsystems is between 10-100 microns. Additionally or alternatively to one or more examples disclosed above, in other examples, the electronic device further comprises an insulator disposed between the plurality of components and the first shielding. Additionally or alternatively to one or more examples disclosed above, in other examples, the electronic device further comprises a plurality of trenches formed in the insulator; and a second shielding disposed in the trenches, wherein the second shielding is a material different than the first shielding. Additionally or alternatively to one or more examples disclosed above, in other examples, the electronic device further comprises: a plurality of trenches formed in the insulator; and a second shielding disposed in the trenches, wherein the second shielding substantially fills the plurality of trenches. Additionally or alternatively to one or more examples disclosed above, in other examples, the electronic device further comprises: an insulator disposed between the plurality of components and the first shielding; and a plurality of trenches formed in the insulator, the plurality of trenches having one or more angled walls. Additionally or alternatively to one or more examples disclosed above, in other examples, the electronic device of claim 1, further comprises: an insulator disposed between the plurality of components and the first shielding; and a plurality of trenches formed in the insulator, the plurality of trenches having one or more angled walls, and a first width and a second width, wherein the first width is located closer to the surface of the substrate than the second width. Additionally or alternatively to one or more examples disclosed above, in other examples, the first width is between 10-100 microns and the second width is between 100-1000 microns. Additionally or alternatively to one or more examples disclosed above, in other examples, the first shielding is a plating film comprising at least one of Copper, Nickel, and Aluminum.

In some examples, a method for forming an electronic device is disclosed. The method may comprise: forming a substrate; forming a system in package assembly, comprising: mounting a plurality of components on the substrate; forming a first shielding disposed between one or more subsystems, the plurality of components included in the one or more subsystems. Additionally or alternatively to one or more examples disclosed above, in other examples, forming the one or more subsystems comprises forming an insulator between the plurality of components and forming a plurality of trenches in the insulator. Additionally or alternatively to one or more examples disclosed above, in other examples, a width of the plurality of trenches is between 10-100 microns. Additionally or alternatively to one or more examples disclosed above, in other examples, the plurality of trenches are formed using a laser source. Additionally or alternatively to one or more examples disclosed above, in other examples, forming the first shielding comprises: depositing a second shielding in the plurality of trenches; removing an excess of the second shielding; and depositing a third shielding on the insulator. Additionally or alternatively to one or more examples disclosed above, in other examples, forming the first shielding includes substantially filling the plurality of trenches. Additionally or alternatively to one or more examples disclosed above, in other examples, forming the one or more subsystems comprises: forming an insulator between the plurality of components; and forming a plurality of trenches in the insulator with one or more angled walls, the one or more angled walls having a first width and a second width, wherein the first width is located closer to the surface of the substrate than the second width. Additionally or alternatively to one or more examples disclosed above, in other examples, the first width is between 10-100 microns and the second width is between 100-1000 microns. Additionally or alternatively to one or more examples disclosed above, in other examples, forming the first shielding includes using at least one of electroless plating, electroplating, chemical vapor deposition, and physical vapor deposition. Additionally or alternatively to one or more examples disclosed above, in other examples, forming the first shielding includes conformally covering one or more sides of the assembly.

While various examples have been described above, it should be understood that they have been presented by way of example only, and not by way of limitation. Although examples have been fully described with reference to the accompanying drawings, the various diagrams can depict an example architecture or other configuration for this disclosure, which is done to aid in the understanding of the features and functionality that can be included in the disclosure. The disclosure is not restricted to the illustrated exemplary architectures or configurations, but can be implemented using a variety of alternative architectures and configurations. Additionally, although the disclosure is described above in terms of various examples and implementations, it should be understood that the various features and functionality described in one or more of the examples are not limited in their applicability to the particular example with which they are described. They instead can be applied alone or in some combination, to one or more of the other examples of the disclosure, whether or not such examples are described, whether or not such features are presented as being part of a described example. Thus, the breadth and scope of the present disclosure should not be limited by any of the above-described examples.

What is claimed is:
1. An electronic device, comprising:
a substrate; and
a system in package assembly including:
  a plurality of components mounted on the substrate,
  one or more subsystems, each subsystem including two or more of the plurality of components, each subsystem separated from an adjacent subsystem by one of a plurality of trenches,
  wherein the plurality of trenches has angled walls, and components included in the subsystem with second profiles, the second profiles being higher than the first profiles,
  a first shielding layer covering a top surface of the one or more subsystems, and
  a plurality of second shielding layers, wherein each second shielding layer is a single layer of shielding material that substantially fills a volume between walls of one of the plurality of trenches,
  a plurality of insulators disposed between the one or more subsystems, each insulator separated from another insulator by one of the plurality of trenches, and
  wherein the first shielding layer includes a material different from the plurality of second shielding layers,
  wherein the first shielding layer covers a top surface of each of the plurality of second shielding layers.
2. The electronic device of claim 1, wherein the substrate further comprises:
one or more metal traces; and a ground plane, wherein the one or more metal traces are electrically connected to the ground plane and the first shielding layer.

3. The electronic device of claim 1, wherein a spacing between adjacent subsystems is between 10-100 microns.

4. The electronic device of claim 1, further comprising:
an insulator disposed between the plurality of components and the first shielding layer.

5. The electronic device of claim 4, wherein the plurality of trenches are formed in the insulator.

6. The electronic device of claim 4, wherein the first shielding layer conformally covers the insulator.

7. The electronic device of claim 4, wherein the insulator is thermally conductive.

8. The electronic device of claim 4, wherein the plurality of components includes one or more first components and one or more second components,
the one or more first components having a lower profile than the one or more second components, and
each first component is located closer to one of the plurality of trenches than one of the second components.

9. The electronic device of claim 1,
wherein each angled wall has a first width and a second width, wherein the first width is located closer to a surface of the substrate than the second width.

10. The electronic device of claim 9, wherein the first width is between 10-100 microns, and the second width is between 100-1000 microns.

11. The electronic device of claim 9, wherein the second width is between 100-500 microns.

12. The electronic device of claim 1, wherein the first shielding layer is a plating film comprising at least one of Copper, Nickel, and Aluminum.

13. The electronic device of claim 1, wherein the substrate is a single printed circuit board (PCB).

14. The electronic device of claim 1, wherein the plurality of components is grouped into the one or more subsystems based on a functionality of the plurality of components.

15. The electronic device of claim 1, wherein the plurality of components occupies substantially a full area of the substrate and the one or more subsystems are electrically isolated from one another.

16. The electronic device of claim 1, further comprising:
one or more metal traces; and
a ground plane, wherein the one or more metal traces and ground plane are located on a same layer as the one or more components.

* * * * *